Jan. 16, 1968 H. W. BASCH 3,363,957

CHASSIS SUPPORT STRUCTURE

Filed June 21, 1966 2 Sheets-Sheet 1

WITNESSES:

INVENTOR
Harry W. Basch
BY
ATTORNEY

United States Patent Office 3,363,957

Patented Jan. 16, 1968

3,363,957

CHASSIS SUPPORT STRUCTURE

Harry W. Basch, Clark, N.J., assignor to Westinghouse Electric Corporation, Pittsburgh, Pa., a corporation of Pennsylvania Filed June 21, 1966, Ser. No. 563,329
3 Claims. (Cl. 312—214)

ABSTRACT OF THE DISCLOSURE

The subject matter of the present disclosure relates to a mounting and support structure for electronic equipment, such as a radio including a chassis having a circuit board with electronic equipments thereon and an external cabinet. The structure comprises a foamed plastic material which is adapted to receive the circuit board and has the outer surfaces thereof formed to fit within the cabinet and secure the chassis therein. The chassis of the radio is thus mounted within the cabinet without the need for brackets and is protected against damage by the resilient foamed plastic material.

Figure 1:
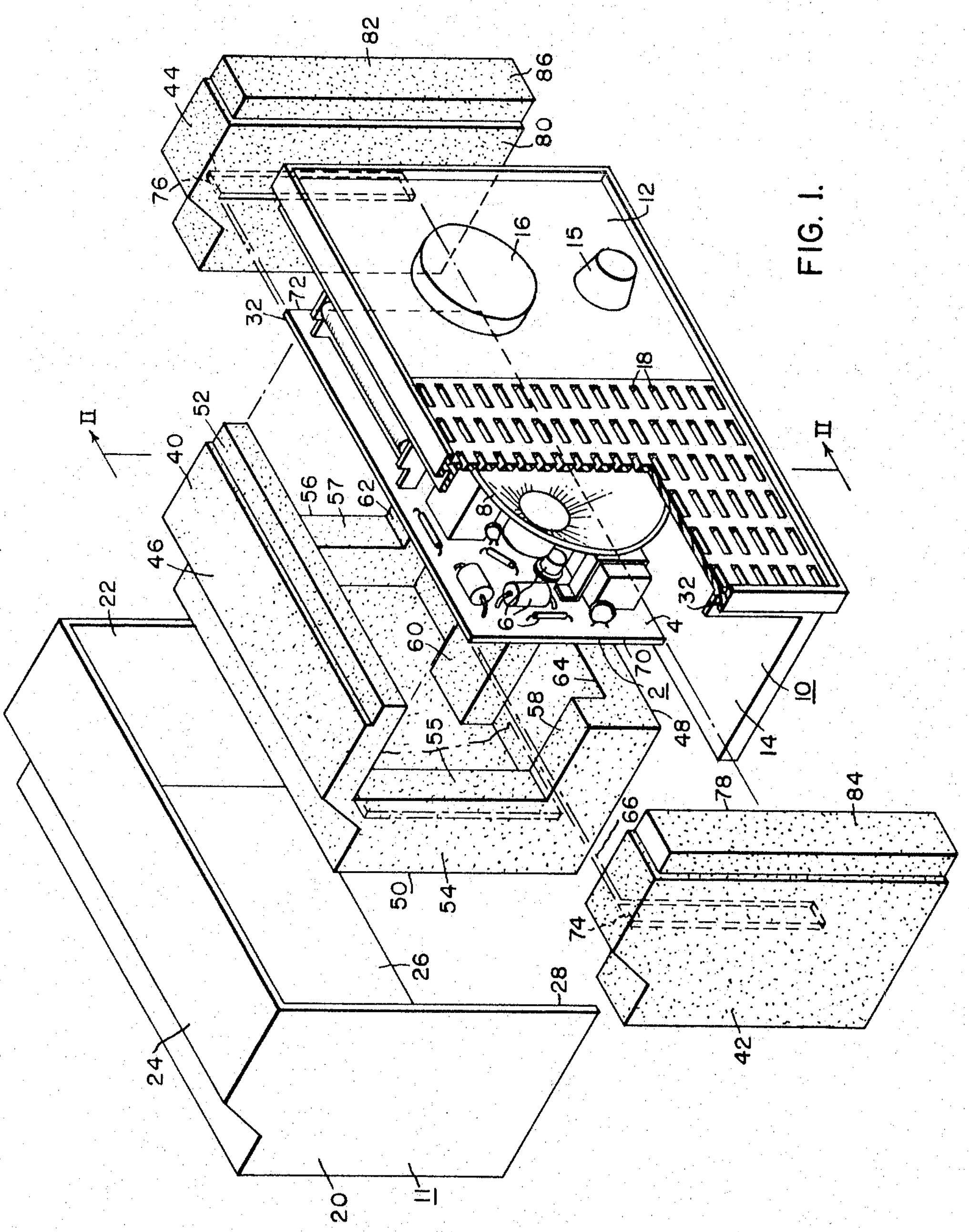

The present invention relates to structures for supporting and mounting electronic equipment and more particularly to chassis support structures for electronic equipment which serves to protect the equipment against damage.

Usually the chassis of electronic equipment, such as a radio receiver, is mounted within a cabinet through the use of metallic brackets or other suitable bracket members which secure the chassis to the cabinet structure. The chassis typically comprises a printed circuit board, or a similar type mounting of member, upon which are mounted electrical components. The cabinet for the electronic equipment is commonly formed of molded plastic, wood or metal, etc. Both the chassis structure and the cabinet are relatively resilient to shocks caused by rough handling. However, due to the use of brackets which secure the chassis to the cabinet structure when rough handling of the equipment occurs, such as due to dropping, shock forces are usually applied to or concentrated at the bracket supports, which in many instances results in a fracture of the cabinet or chassis structure. The chances of damage are most likely to occur at the structures adjacent to the support brackets. Thus, the accidental dropping of a table model radio can easily result in fracturing of the cabinet or chassis while the cabinet and chassis would, in many cases, be capable of sustaining such a fall without damage in the absence of such non-resilient mounting brackets.

Another disadvantage which results from the use of mounting brackets is that of requiring extra tooling and assembly procedures in oder to provide for the bracketing of the chassis to the cabinet of the radio receiver. This may be a serious disadvantage from a cost standpoint, especially in consumer oriented equipment such as table radios.

It is therefore an object of the present invention to provide new and improved support and mounting structures for electronic equipment which can sustain rough handling without damage thereto.

It is a further object to provide new and improved support and mounting structures for electronic equipment which does not require the use of brackets for securing the chassis to the external cabinet of the equipment and thereby minimizes damage to the equipment due to rough handling.

It is a further object to provide new and improved mounting and support structures for electronic equipment wherein the chassis of the equipment is mounted within a resilient material which absorbs shocks due to rough handling.

It is a further object of the present invention to provide new and improved mounting and support structures for electrical equipment in which the chassis is mounted within the external cabinet of the equipment through the use of a resilient material which absorbs shocks resulting from rough handling and which also may improve the acoustical properties of the equipment.

Broadly, the above cited objects are accomplished by providing mounting and support structures for electronic equipment in which the chassis of the equipment is mounted through a resilient material and supported thereby. The resilient material is fabricated of such a shape to conform substantially to the shape of the cabinet of the equipment, so that the chassis is supported within a resilient structure without the need of brackets between the cabinet and the chassis, with the electronic equipment thereby being capable of absorbing shocks without damage resulting thereto.

Figure 2:
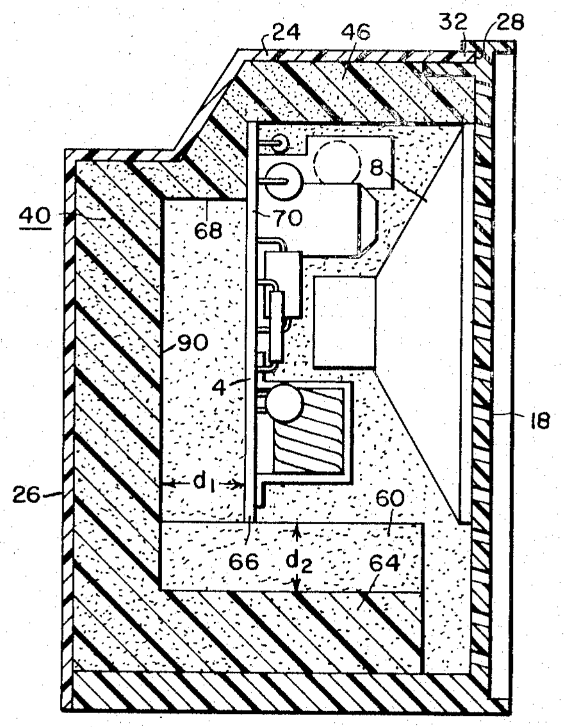

These and other objects and advantages of the present invention will become more apparent when considered in view of the following specification and drawing, in which:

FIGURE 1 is a pictorial assembly drawing of the structure of the present invention; and FIG. 2 is a sectional view taken generally along the line II—II of FIG. 1 with the structure being assembled and being somewhat enlarged in size compared to FIG. 1.

Referring now to FIGS. 1 and 2, a specific embodiment of the present invention is shown in the form of a table model radio. However, it should be understood that various other types of electronic equipment could be similarly supported and mounted according to the teachings of the present invention. In FIG. 1 the radio is shown having a chassis 2 including a component mounting member 4, which may conveniently comprise a printed circuit board or other type of circuit board. Mounted on the printed circuit board 4 are a plurality of electrical components 6 which may include resistors, capacitors, inductors, etc., and also active elements such as transistors or vacuum tubes. Also included on the circuit board 4 is a loudspeaker 8 from which the audio output of the radio receiver emanates.

The cabinet of the radio comprises two portions, a front member 10 and a back member 11. The members 10 and 11 of the cabinet may conveniently be formed of a plastic material by plastic molding processes which are well known in the art or may be fabricated of other suitable materials. The front member 10 of the cabinet includes a frontal portion 12 and a base portion 14 disposed at right angles to the front portion 12. On the front portion 12 is mounted an on-off volume control knob 15 controlling the mentioned functions and a tuning control knob 16 which serves to tune the radio to various frequencies as is well known in the art. The front portion 12 also has a grill portion 18 with a plurality of apertures appearing therein. These apertures may be formed in the molding process of the front member. The speaker 8 is disposed behind the grill portion 18 as can be seen by the cutout portion of the grill portion 18.

The back member 11 includes side portions 20 and 22, a top portion 24 and a back portion 26. The front member 10 and the back member 11 are so constructed that when placed together a unitary cabinet structure will be formed. A front edge 28 of the back member 11 engages a slot channel 32 of the front member 10 which is formed in the front member 10 from the base portion 14 around the front portion 12 thereof, with the unitary cabinet structure being completed when secured together thereby.

The usual method of securing the printed circuit board to the cabinet would be through the use of a bracket or molded bosses which would be rigidly fixed to the printed circuit board and have the other end fitted into a preformed portion in either the front or back member of the cabinet. As explained previously, if such a structure is subjected to rough handling such as by dropping, the impact will cause large shock forces to be applied at the bracketing portion which would tend to cause damage to the cabinet, the printed circuit board chassis and the components thereof. This is avoided in the present invention by eliminating the use of brackets and providing resilient mounting members which surround the chassis board and secure it within the cabinet. The resilient material may ideally comprise a foamed plastic material such as polystyrene, polyurethane or other expanded plastic materials.

In a specific embodiment shown in FIGS. 1 and 2, the mounting and securing structures for the chassis 2 is shown to comprise three members, a central member 40 and two end members 42 and 44. These members 40, 42 and 44 are formed of a foamed plastic material such as polystyrene or polyurethane and are so formed that their exterior outer surfaces conform to the inner shape of the front and back cabinet members 10 and 12. The desired shape of the mounting members 40, 42 and 44 may be achieved through well known molding processes for such materials or through other shaping techniques well known for the processing of such materials.

Referring specifically to the mounting members as utilized in FIGS. 1 and 2, the central member 40 has a top portion 46 which conforms to the shape of the top portion 24 of the back member 11. Central member 40 also has a bottom portion 48 which is substantially flat and conforms to the bottom portion 14 of the front member 10. The mounting member 40 has a back portion 50 which conforms to the back portion 26 of the back member 11. When the front member 10 and the back member 12 are placed in position the outer portions of the central member 40 will thus form a snug fit with the internal portions of the cabinet members.

The top portion 46 of the central member 40 includes a cut-away portion 52 which is designed to fit under the channel portion 32 of the front member 10. The central member 40 also includes side portions 54 and 56 which are cut-away from the top and bottom portions 46 and 48 so that side portions 54 and 56 are recessed somewhat from the front of these portions and have front surfaces 55 and 57, respectively. Extending from the bottom portion 48 of the member 40 are leg portions 58, 60 and 62, which extend a distance vertically from the inside surface 64 of the bottom portion 48. The legs 58, 60 and 62 serve as a bottom support for the chassis board 4.

As can be better seen in FIG. 2, the top portion 46 of the central member 40 has an inner surface including surfaces 68 and 70 disposed at right angles so that the chassis board 24 may abut thereagainst in the final assembly. The printed circuit board 4 is thus mounted with the bottom portion resting on the leg members 58, 60 and 62 and the top thereof abutting against the right angle surfaces 68 and 70 of the inner surface of the top portion 46. The front portions 55 and 57 of the side portions 54 and 56, respectively, support the back of the circuit board 4.

The printed circuit board 4 extends beyond the end portions 54 and 56 of the central mounting member 40 so that the side surfaces 70 and 72 of the printed circuit board 4 are free to engage a slot 74 and a slot 76 formed, respectively, in the inside surfaces 78 and 80 of the end mounting members 42 and 44. These slots 74 and 76 are formed in the vertical dimension of the side members 42 and 44 and extend a predetermined distance into the side members 42 and 44. Thus, by disposing the side members 42 and 44 adjacent the central member 40, and with the slots 74 and 76 being so positioned to receive the end portions 70 and 72 of the pritned circuit board 4, a support and mounting structure will be formed for the chassis 2 by the members 40, 42 and 44. With the members 40, 42 and 44 securing the chassis board 4 in position, the cabinet members 10 and 11 may be assembled together to complete the unitary radio structure. The top, bottom and back outside surface of the side members 42 and 44 are so formed of the foamed plastic material that they conform to the inner surfaces of the adjacent front or back members of the cabinet. The front portions 84 and 86 of the side members 42 and 44 respectively, are cut-away so that they will fit behind the channel 32 of the front member 10.

The assembled chassis 2 in the cabinet is shown in FIG. 2 with the printed circuit board 4 being securely held within the mounting members 40, 42 and 44 and the mounting members with their exterior surfaces conforming to the interior surfaces of the front and back members 10 and 11 of the cabinet to secure these members within the cabinet. A space having a dimension $d1$ is provided between front edges 55 and 57 of the side portions 54 and 56 at the back of the printed circuit board 4 and the inside back surface 90 of the central member 40. This space provides an air space for cooling and air circulation within the cabinet. Also, additional air space is provided by the dimension $d2$ between the bottom surface 64 of the central member 40 and the top of the leg portions 58, 60 and 62, where the bottom of the printed circuit board 4 rests. The front of the chassis board is open to the grill portion 18 with the speaker 8 being disposed therebehind. The apertures in the grill portion 18 permit air access to the internal portions of the structure.

The mounting structure thus provided forms essentially a floating mount for the chassis 4 within the resilient foamed plastic material supports 40, 42 and 44. The resilient material acts to damp out any shocks applied to the chassis 2. Moreover, the foamed plastic members 40, 42 and 44 form a resilient connection to the cabinet members 10 and 11 to attenuate shocks that might thereby be applied. Thus, if the radio should be dropped or be subjected to other rough handling, the forces applied to the chassis thereof are attenuated due to the floating type of mounting so that damage due to such rough handling will be effectively minimized. Damage to the cabinet structure will also be minimized because of the absence of reactive forces being applied thereto by the chassis board at the moment of impact, this reactive force being absorbed by foamed material surrounding the chassis itself.

It has also been noticed that improved acoustical characteristics are obtained by the inclusion of the foamed material within the cabinet around the speaker 8 of the radio circuitry. This is probably due to the fact that the foamed material members form a better baffle than would otherwise be obtained when the speaker is merely mounted in the open cabinet cavity.

In the specific embodiment shown in FIGS. 1 and 2 a three piece mounting structure including the members 40, 42 and 44 is shown. However, it should be understood that it is not essential that a three piece structure be used, but structures including more or less of the foamed plastic material members could be utilized depending upon the particular application. In many instances a two piece structure would be preferable to the three piece structure as shown; however, it is deemed that such modifications are within the scope of the present invention.

Although the present invention has been described with a certain degree of particularity it should be understood that the present disclosure has been made only by way of example and numerous changes in the details of construction and the combination of parts and elements may be resorted to without departing from the scope and the spirit of the present invention.

I claim as my invention:

1. In electronic equipment the combination of:

a chassis including a circuit board having electrical components thereon;

a cabinet;

and mounting member means comprising a foamed plastic material, said mounting member means being adapted to secure said chassis in position, and including an inner portion within which said circuit board is disposed and secured and an outer portion having surfaces thereon conforming substantially to inner portions of said cabinet so that said mounting means is fixed within said cabinet, said mounting member means being disposed within said cabinet so that said chassis is mounted therein in such a manner that shock forces applied to said equipment will be attenuated by said foamed plastic material and will minimize damage to said chassis and cabinet.

2. The combination of claim 1 wherein:

said mounting member means including end portions having slots therein for receiving said circuit board and securing said chassis therein and having portions therein for situating said circuit board so that ventilation spaces are provided about said chassis.

3. The combination of claim 1 wherein:

said chassis includes a speaker, said speaker being disposed with respect to said mounting member means so that the acoustical properties of said electronic equipment are improved due to the effect of the foamed plastic material.

References Cited

UNITED STATES PATENTS

| | | | |
|---|---|---|---|
| 2,795,639 | 6/1957 | Rawson | 312—7 X |
| 3,109,687 | 11/1963 | Dereng | 312—7 X |
| 3,162,813 | 12/1964 | Piccinini | 312—7 X |
| 3,229,936 | 1/1965 | Quillinan. | |
| 3,241,661 | 3/1966 | Zamzow et al. | |
| 3,275,131 | 9/1966 | Erickson. | |
| 3,285,400 | 11/1966 | High. | |

CASMIR A. NUNBERG, *Primary Examiner.*